United States Patent
Shi et al.

(10) Patent No.: US 12,232,366 B2
(45) Date of Patent: Feb. 18, 2025

(54) DISPLAY PANEL, METHOD FOR MANUFACTURING SAME, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bo Shi, Beijing (CN); Chi Yu, Beijing (CN); Rui Zhou, Beijing (CN); Hui Guan, Beijing (CN); Yue Long, Beijing (CN); Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 696 days.

(21) Appl. No.: 17/618,005

(22) PCT Filed: Feb. 23, 2021

(86) PCT No.: PCT/CN2021/077504
§ 371 (c)(1),
(2) Date: Dec. 10, 2021

(87) PCT Pub. No.: WO2022/178676
PCT Pub. Date: Sep. 1, 2022

(65) Prior Publication Data
US 2023/0172001 A1 Jun. 1, 2023

(51) Int. Cl.
*H10K 59/122* (2023.01)
*H10K 59/80* (2023.01)
*H10K 102/00* (2023.01)

(52) U.S. Cl.
CPC ....... *H10K 59/122* (2023.02); *H10K 59/8731* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 2007/0087645 A1* | 4/2007 | Tsujii | H10K 71/135 445/24 |
| 2018/0053810 A1 | 2/2018 | Jin et al. | |

(Continued)

FOREIGN PATENT DOCUMENTS

| | | |
|---|---|---|
| CN | 107180852 A | 9/2017 |
| CN | 110780375 A | 2/2020 |

(Continued)

*Primary Examiner* — Alexander G Ghyka
(74) *Attorney, Agent, or Firm* — Lippes Mathias LLP

(57) ABSTRACT

Provided is a display panel, including a base substrate provided with a first display region and a second display region and a plurality of pixels and a packaging layer that are sequentially arranged on the base substrate. The packaging layer includes a first organic layer, and the second display region has a relatively large transmittance. The second display region includes a first sub-display region and a second sub-display region that is proximal to a border of the base substrate relative to the first sub-display region. A difference between a maximum thickness and a minimum thickness of a first portion, disposed in the second display region, of the first organic layer is less than a difference between a maximum thickness and a minimum thickness of a second portion disposed in the second sub-display region.

20 Claims, 13 Drawing Sheets

(56) References Cited

U.S. PATENT DOCUMENTS

| | | | |
|---|---|---|---|
| 2020/0035944 A1* | 1/2020 | Wang | H10K 50/8426 |
| 2020/0091247 A1 | 3/2020 | Lee et al. | |
| 2020/0251682 A1* | 8/2020 | Guo | H10K 50/844 |
| 2020/0258960 A1* | 8/2020 | Choi | H10K 59/121 |
| 2022/0069262 A1 | 3/2022 | Yu et al. | |

FOREIGN PATENT DOCUMENTS

| | | |
|---|---|---|
| CN | 110911441 A | 3/2020 |
| CN | 111752417 A | 10/2020 |

* cited by examiner

DISPLAY PANEL, METHOD FOR MANUFACTURING SAME, AND DISPLAY DEVICE

CROSS-REFERENCE TO RELATED APPLICATION

This application is a 371 of PCT Application No. PCT/CN2021/077504, filed on Feb. 23, 2021, the disclosure of which is herein incorporated by reference in its entirety.

TECHNICAL FIELD

The present disclosure relates to the field of display technologies, and in particular, relates to a display panel, a method for manufacturing the same, and a display device.

BACKGROUND

Under-display camera technology is a brand-new technology proposed to increase a screen-to-body ratio of a display device.

SUMMARY

Embodiments of the present disclosure provide a display panel, a method for manufacturing the same, and a display device. The technical solutions are as follows:

In an aspect, a display panel is provided. The display panel includes:

a base substrate provided with a first display region and a second display region, wherein the first display region includes a first sub-display region and a second sub-display region, and at least partially surrounds the second display region, the second sub-display region being proximal to a border of the base substrate relative to the first sub-display region;

a plurality of pixels separately disposed in the first display region and the second display region, wherein at least two pixels in the plurality of pixels include target electrodes and are separately disposed in the first display region and the second display region, a size of the target electrode disposed in the second display region being less than a size of the target electrode disposed in the first display region, and/or a density of the target electrodes disposed in the second display region being less than a density of the target electrodes disposed in the first display region; and a packaging layer disposed on a side, distal from the base substrate, of the plurality of pixels, wherein the packaging layer includes a first organic layer, and a difference between a maximum thickness and a minimum thickness of a first portion, disposed in the second display region, of the first organic layer being less than a difference between a maximum thickness and a minimum thickness of a second portion, disposed in the second sub-display region, of the first organic layer.

In some embodiments, the first display region surrounds the second display region; and the base substrate at least includes a first edge and a second edge that are parallel to each other;

wherein a distance between a geometric center of the second display region and the first edge of the base substrate is less than a distance between a geometric center of the second display region and the second edge of the base substrate.

In some embodiments, the base substrate is a rectangle, and the first edge and the second edge are both short edges of the rectangle.

In some embodiments, in a direction toward the first edge, a thickness of the first organic layer is gradually decreased; and an average thickness of the first portion of the first organic layer is greater than an average thickness of the second portion of the first organic layer.

In some embodiments, the difference between the maximum thickness and the minimum thickness of the second portion of the first organic layer is less than a first difference threshold.

In some embodiments, the difference between the maximum thickness and the minimum thickness of the first portion of the first organic layer is less than a second difference threshold.

In some embodiments, the display panel further includes: a second organic layer, disposed on a side distal from the plurality of pixels, of the base substrate;

wherein a thickness variation amount of the first organic layer and a thickness variation amount of the second organic layer are both less than a variation amount threshold.

In some embodiments, the thickness variation amount of the first organic layer is equal to the thickness variation amount of the second organic layer.

In some embodiments, in at least one target cross-section, a difference between a thickness of the first organic layer and a thickness of the second organic layer is less than or equal to a third difference threshold, wherein the target cross-section is a cross-section of the display panel in a target direction, and the target direction is perpendicular to an arrangement direction of the first display region and the second display region.

In some embodiments, in the at least one target cross-section, the thickness of the first organic layer is equal to the thickness of the second organic layer.

In some embodiments, the first organic layer and the second organic layer are both made of polymethylmethacrylate.

In some embodiments, the packaging layer further includes a first inorganic layer disposed between the plurality of pixels and the first organic layer.

In some embodiments, the display panel further includes a second inorganic layer disposed between the second organic layer and the base substrate.

In some embodiments, the packaging layer further includes a third inorganic layer disposed on a side, distal from the plurality of pixels, of the first organic layer.

In some embodiments, the display panel further includes a fourth inorganic layer disposed on a side, distal from the base substrate, of the second organic layer.

In some embodiments, a difference between a maximum thickness and a minimum thickness of the first inorganic layer and a difference between a maximum thickness and a minimum thickness of the second inorganic layer both fall within a first difference range;

and/or a difference between a maximum thickness and a minimum thickness of the third inorganic layer and a difference between a maximum thickness and a minimum thickness of the fourth inorganic layer both fall within a second difference range.

In some embodiments, an inorganic layer in the display panel is made of at least one of silicon dioxide (SiO), silicon nitride (SiN), and silicon oxynitride (SiNO).

In some embodiments, the target electrode is an anode.

In another aspect, a method for manufacturing a display panel is provided. The method includes:

providing a base substrate, wherein the base substrate is provided with a first display region and a second display region, the first display region including a first sub-display region and a second sub-display region and at least partially surrounding the second display region, the second sub-display region being proximal to a border of the base substrate relative to the first sub-display region;

forming a plurality of pixels on a side of the base substrate, wherein the plurality of pixels are separately disposed in the first display region and the second display region, at least two pixels in the plurality of pixels include target electrodes and are separately disposed in the first display region and the second display region, a size of the target electrode disposed in the second display region being less than a size of the target electrode disposed in the first display region, and/or a density of the target electrodes disposed in the second display region being less than a density of the target electrodes disposed in the first display region; and forming a packaging layer on a side, distal from the base substrate, of the plurality of pixels, wherein the packaging layer includes a first organic layer, a difference between a maximum thickness and a minimum thickness of a first portion, disposed in the second display region, of the first organic layer being less than a difference between a maximum thickness and a minimum thickness of a second portion, disposed in the second sub-display region, of the first organic layer.

In some embodiments, forming the first organic layer on the side, distal from the base substrate, of the plurality of pixels includes:

printing a first organic layer material on the side, distal from the base substrate, of the plurality of pixels; and forming the first organic layer by performing curing on the first organic layer material after the first organic layer material is planarized.

In some embodiments, forming the first organic layer by performing the curing on the first organic layer material includes:

providing a mask with a through hole, wherein the through hole is provided in the second sub-display region;

precuring the first organic layer material by the mask; and forming the first organic layer by performing the curing on the precured first organic layer material.

In some embodiments, the method further includes:

forming a second organic layer on a side, distal from the plurality of pixels, of the base substrate, wherein a thickness variation amount of the first organic layer and a thickness variation amount of the second organic layer are both less than a variation amount threshold.

In some embodiments, forming the second organic layer on the side, distal from the plurality of pixels, of the base substrate includes:

printing a second organic layer material on the side, distal from the plurality of pixels, of the base substrate; and forming the second organic layer by performing the curing on the second organic layer material after the second organic layer material is planarized.

In some embodiments, the packaging layer further includes a first inorganic layer disposed between the plurality of pixels and the first organic layer; and the method further includes:

forming a second inorganic layer on the side, distal from the plurality of pixels, of the base substrate by a deposition process; and forming the second organic layer on the side, distal from the plurality of pixels, of the base substrate includes:

forming the second organic layer on a side, distal from the base substrate, of the second inorganic layer.

In some embodiments, the packaging layer further includes a third inorganic layer disposed on a side, distal from the plurality of pixels, of the first organic layer; and the method further includes:

forming a fourth inorganic layer on a side, distal from the base substrate, of the second organic layer by a deposition process.

In still another aspect, a display device is provided. The display device includes a photosensitive sensor and the display panel in the foregoing aspect. The photosensitive sensor is disposed in a second display region of the display panel.

BRIEF DESCRIPTION OF THE DRAWINGS

To describe the technical solutions in the embodiments of the present disclosure more clearly, the following briefly introduces accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, the present disclosure is described in detail hereinafter with reference to the accompanying drawings.

At present, in a display panel included in a display device with an under-display camera, a base substrate is usually provided with a first display region and a transparent second display region. The camera in the display device may be disposed in the second display region. In addition, to ensure effective display of the display panel, the camera needs to be disposed near a border of the base substrate. That is, the second display region is disposed at the border of the base substrate.

However, under the impact of an arrangement position, at present, a camera in a display device with an under-display camera has a relatively low imaging resolution and a relatively poor imaging effect.

With the development of display technologies, neither a notch screen nor a hole screen can meet a user's requirement for a high screen-to-body ratio. Correspondingly, a series of display panels with a transparent display region have emerged. In the display panel of this type, a hardware structure such as a camera may be directly disposed in the transparent display region. In this way, a true full-screen display becomes possible. The display panel of this type may also be referred to as a full display camera (FDC) display panel. In some embodiments, the camera may include a photosensitive sensor.

Figure 1:
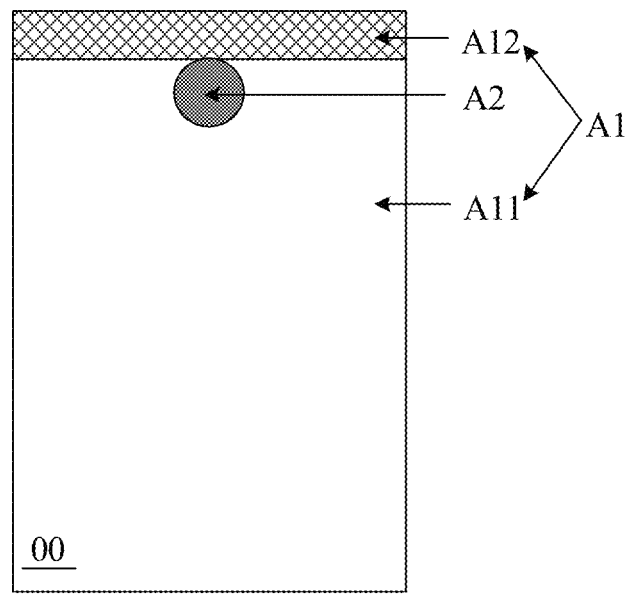
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel includes a base substrate 00. The base substrate 00 is provided with a first display region A1 and a second display region A2. The first display region A1 at least partially surrounds the second display region A2. The first display region A1 includes a first sub-display region A11 and a second sub-display region A12. The second sub-display region A12 is proximal to a border of the base substrate 00 relative to the first sub-display region A11.

For example, referring to FIG. 1, the base substrate 00 shown in FIG. 1 is rectangular. The second display region A2 is disposed right at the center of the top of the base substrate 00, and any side of the second display region A2 is surrounded by the first display region A1. That is, the second display region A2 is surrounded by the first display region A1. In addition, FIG. 1 shows that the second sub-display region A12 is proximal to an upper border of the base substrate 00 relative to the first sub-display region A11. The following embodiments are all described by taking an example in which the display panel has the structure shown in FIG. 1.

Certainly, in some embodiments, the base substrate 00 has another shape and the second display region A2 is disposed at another position, instead of the center of the top of the base substrate 00. For example, the second display region A2 may be disposed at an upper left corner or an upper right corner of the base substrate 00.

Figure 2:
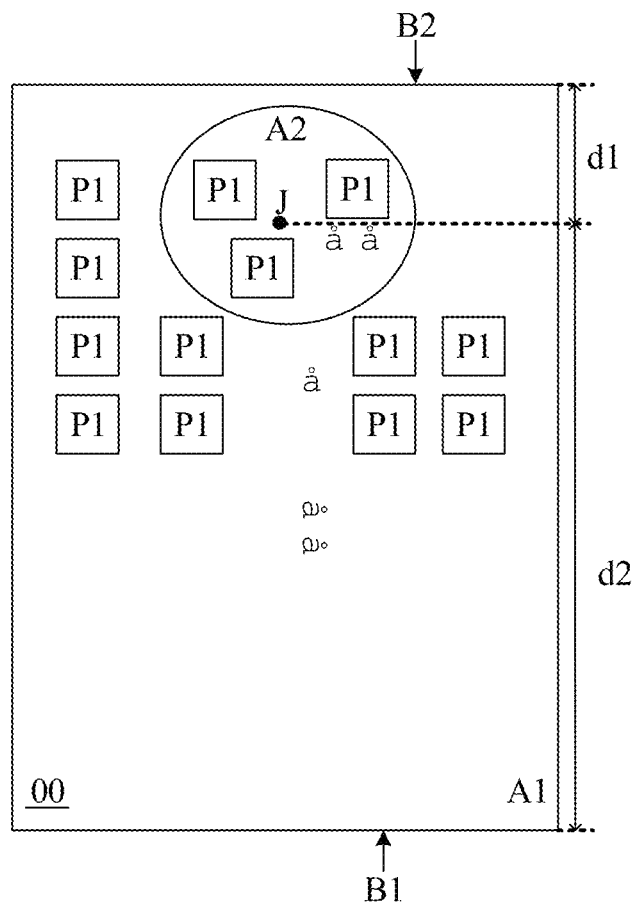
FIG. 2 is a schematic structural diagram of a display panel according to another embodiment of the present disclosure.
Figure 3:
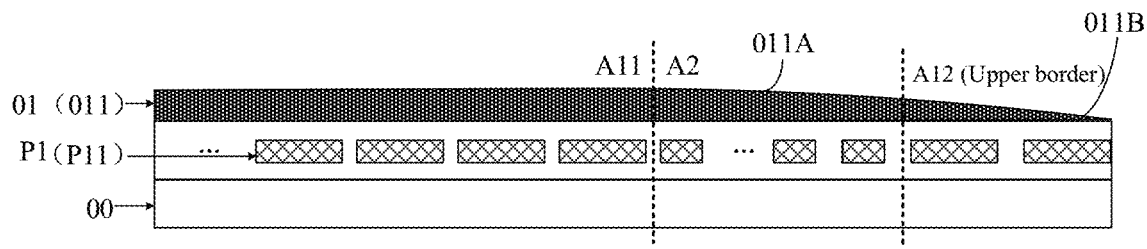
FIG. 3 is a schematic structural diagram of a display panel according to still another embodiment of the present disclosure.

FIG. 2 is a schematic structural diagram of a display panel according to another embodiment of the present disclosure. FIG. 3 is a schematic structural diagram of a display panel according to still another embodiment of the present disclosure. As can be seen from FIG. 2 and FIG. 3, the display panel may further include: a plurality of pixels P1 separately disposed in the first display region A1 and the second display region A2 on the base substrate 00. At least two pixels P1 in the plurality of pixels P1 include target electrodes P11. The at least two pixels P1 including the target electrodes P11 are separately disposed in the first display region A1 and the second display region A2. FIG. 2 only schematically shows the display panel, and for actual ratios of the regions, reference may be made to FIG. 1.

In some embodiments, a size of the target electrode P11 disposed in the second display region A2 is less than a size of the target electrode P11 disposed in the first display region A1, and/or a density of the target electrodes P11 disposed in the second display region A2 is less than a density of the target electrodes P11 disposed in the first display region A1. That is, the target electrodes P11 disposed in the second display region A2 have a different size and/or density. A density of the target electrodes P11 in each display region may be a number of target electrodes P11 included in a unit area. In this way, the transmittance of the second display region A2 is greater than the transmittance of the first display region A1. That is, the second display region A2 according to the embodiment of the present disclosure may be a transparent display region recorded in the foregoing embodiment. Correspondingly, as recorded in the foregoing embodiment, a hardware structure such as a camera is disposed in the second display region A2. Further, in the embodiment of the present disclosure, the first display region A1 may also be referred to as a normal display region, and the second display region A2 is referred to as a camera display region for taking both photographing and displaying functions.

For example, referring to the display panel shown in FIG. 3, the size of the target electrode P11 disposed in the second display region A2 is less than the size of the target electrode P11 disposed in the first display region A1. The density of the target electrodes P11 disposed in the second display region A2 is equal to the density of the target electrodes P11 disposed in the first display region A1. That is, the number of target electrodes P11 in every inch of the first display region A1 is equal to the number of target electrodes P11 in every inch of the second display region A2. The density may also be represented by a resolution (pixels per inch, PPI). Correspondingly, the structure shown in FIG. 3 may also be understood as that the transmittance of the second display region A2 is increased by reducing the size of the target electrode P11 in the second display region A2 without changing the PPI.

Figure 4:
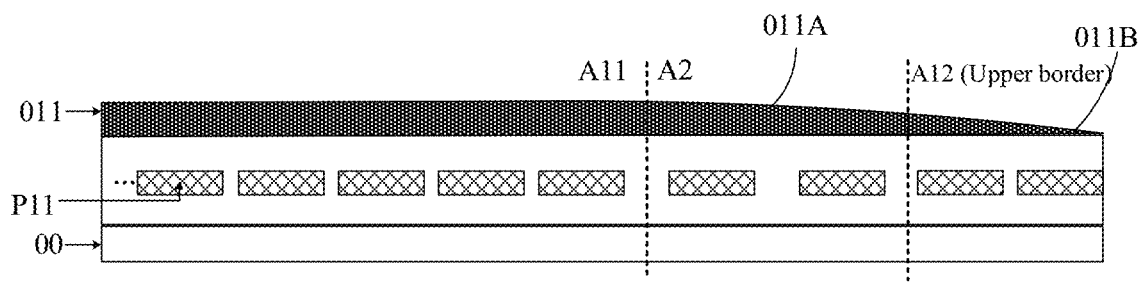
FIG. 4 is a schematic structural diagram of a display panel according to still another embodiment of the present disclosure.

In another example, referring to the display panel shown in FIG. 4, the density of the target electrodes P11 disposed in the first display region A1 is greater than the density of the target electrodes P11 disposed in the second display region A2. The size of the target electrode P11 disposed in the first display region A1 is equal to the size of the target electrode P11 disposed in the second display region A2. That is, the transmittance of the second display region A2 can be increased by reducing the PPI of the second display region A2 without changing the size of the target electrode P11.

Figure 5:
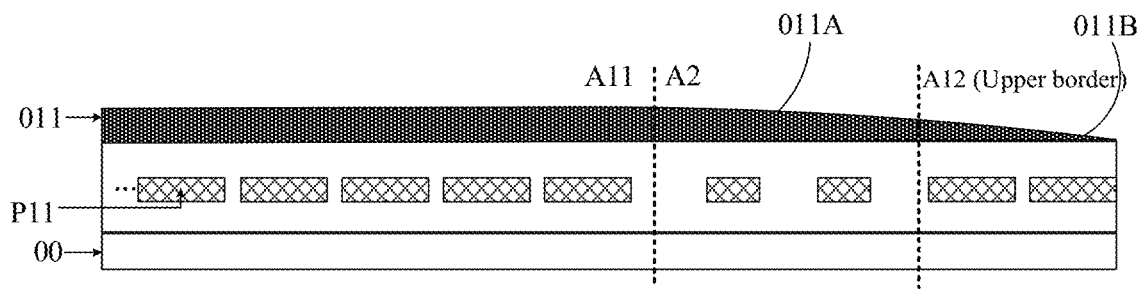
FIG. 5 is a schematic structural diagram of a display panel according to still another embodiment of the present disclosure.

In still another example, referring to the display panel shown in FIG. 5, the density of the target electrodes P11 disposed in the first display region A1 is greater than the density of the target electrodes P11 disposed in the second display region A2. The size of the target electrode P11 disposed in the second display region A2 is less than the size of the target electrode P11 disposed in the first display region A1. That is, the transmittance of the second display region A2 can be increased by both reducing the PPI of the second display region A2 and reducing the size of the target electrode P11 in the second display region A2.

In some embodiments, continuing to refer to FIG. 2 to FIG. 5, the display panel according to the embodiment of the present disclosure may further include: a packaging layer 01 disposed on a side, distal from the base substrate 00, of the plurality of pixels P1. The packaging layer 01 is configured to isolate the plurality of pixels P1 from outside, to avoid the permeation of water and oxygen, thereby ensuring the service life of the display panel. In some embodiments, referring to FIG. 3 to FIG. 5, the packaging layer 01 at least includes a first organic layer 011.

However, the second display region A2 is disposed at a border (for example, an upper border shown in FIG. 2) of the base substrate 00. Therefore, a portion, disposed in the second display region A2, of the first organic layer 011 has a relatively steep downward slope to extend toward the border. That is, a thickness variation amount of the portion, disposed in the second display region A2, of the first organic layer 011 is relatively large.

Through tests, in the current display panel, a thickness of a portion, disposed in the second display region A2 and distal from the border, of the first organic layer 011 is approximately 10 micrometers (μm) to 14 μm. A thickness of a portion, disposed in the second display region A2 and proximal to the border, of the first organic layer 011 is approximately 4 μm to 7 μm. That is, a difference between a maximum thickness and a minimum thickness of the portion, disposed in the second display region A2, of the first organic layer 011 is approximately 6 μm to 7 μm.

In addition, through tests, the thickness difference of the first organic layer 011 causes that the portion, disposed in the second display region A2, of the first organic layer 011 has a wedge-shaped plate structure that "the front and rear surfaces are not parallel and have a certain included angle." The wedge-shaped plate structure further results in that a light ray emitted from the camera disposed in the second display region A2 undergoes refraction and deviates from a main optical axis. A diffraction spot is stretched, that is, a central diffraction spot is elliptical. Accordingly, an image imaged by the camera has relatively large resolution offsets in a stretching direction (that is, a meridional direction) and a sagittal direction. In this way, the overall imaging resolution of the camera is relatively low, that is, an imaging effect is relatively poor.

Continuing to refer to FIG. 3 to FIG. 5, in the embodiment of the present disclosure, a difference between a maximum thickness and a minimum thickness of a first portion 011A, disposed in the second display region A2, of the first organic layer 011 is less than a difference between a maximum thickness and a minimum thickness of a second portion 011B, disposed in a second sub-display region A12, of the first organic layer 011. That is, the steepness (which may also be referred to as an inclination degree) of the first portion 011A of the first organic layer 011 is small relative to the second portion 011B. That is, the first portion 011A is relatively planar. In other words, although the portion, disposed in the second display region A2, of the first organic layer 011 still extends along a downward slope in a direction toward the upper border, the first portion 011A, disposed in the second display region A2, of the first organic layer 011 has a reduced climbing distance. In this way, a light ray emitted from the camera can be effectively prevented from deviating from the main optical axis, to enable the central diffraction spot of the light ray emitted from the camera to be as circular as possible and to enable an image imaged by the camera to have a small resolution offset in the meridional direction and the sagittal direction. Further, the overall imaging resolution of the camera is better.

Figure 6:
FIG. 6 is a schematic diagram of an image formed by a display panel in the related art.
Figure 7:
FIG. 7 is a schematic diagram of an image formed by a display panel according to an embodiment of the present disclosure.

For example, with the same imaging picture as an example, FIG. 6 is a schematic diagram of an image formed by a display panel in the related art and FIG. 7 is a schematic diagram of an image formed by a display panel according to an embodiment of the present disclosure. As can be seen by comparing FIG. 6 with FIG. 7, the embodiment of the present disclosure effectively improves the imaging resolution of the display panel, such that the display panel has a better imaging effect.

In summary, according to the display panel provided by the embodiments of the present disclosure, the display panel includes a base substrate provided with a first display region and a second display region. The first display region includes a first sub-display region and a second sub-display region proximal to a border of the base substrate relative to the first sub-display region. The display panel further includes a plurality of pixels and a packaging layer that are disposed on a side of the base substrate. The packaging layer includes a first organic layer. A difference between a maximum thickness and a minimum thickness of a first portion, disposed in the second display region, of the first organic layer is less than a difference between a maximum thickness and a minimum thickness of a second portion, disposed in the second sub-display region, of the first organic layer. That is, a portion, disposed in the second display region, of the first organic layer is relatively planar, which effectively prevents a focus of a light ray emitted from a camera disposed in the second display region from deviating from a main optical axis due to refraction. In this way, it is ensured that the camera has a better imaging resolution, such that the display panel has a better imaging effect.

In some embodiments, as shown in FIG. 1 and FIG. 2, in the display panel according to the embodiments of the present disclosure, the base substrate 00 is rectangular. That is, the base substrate 00 includes a first edge B1 and a second edge B2 that are parallel to each other. The first display region A1 surrounds the second display region A2. In addition, a distance d1 between a geometric center J of the second display region A2 and the first edge B1 of the base substrate 00 is less than a distance d2 between a geometric center J of the second display region A2 and the second edge B2 of the base substrate 00.

For example, the base substrate 00 is a rectangle in FIG. 2, and the first edge B1 and the second edge B2 may be both short edges of the rectangle. That is, the first edge B1 and the second edge B2 may be widths of the rectangle. Correspondingly, as recorded in the foregoing embodiment, the second display region A2 is proximal to the upper border of the base substrate 00.

In addition, as can be seen from the foregoing display panel shown in FIG. 2 to FIG. 5, in a direction toward the first edge B1, that is, in a direction toward the upper border of the base substrate 00, the thickness of the first organic layer 011 is gradually decreased, and an average thickness of the first portion 011A of the first organic layer 011 is greater than an average thickness of the second portion 011B of the first organic layer 011. That is, in a direction toward the second edge B2, the first organic layer 011 gradually becomes planar.

Figure 8:
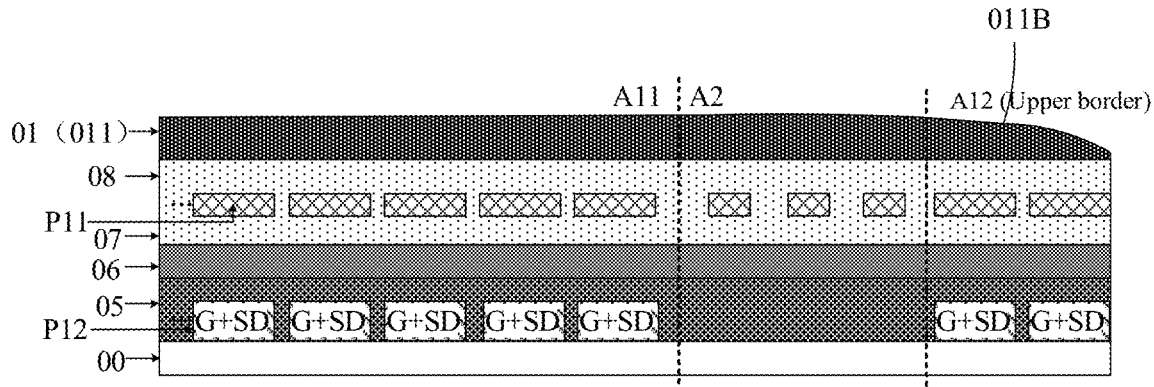
FIG. 8 is a schematic structural diagram of a display panel according to still another embodiment of the present disclosure.

In an optional embodiment, FIG. 8 shows still another display panel. The difference between the maximum thickness and the minimum thickness of the second portion 011B of the first organic layer 011 is less than a first difference threshold and is greater than or equal to 0. That is, the second portion 011B, disposed in the second sub-display region A12 (that is, close to the border), of the first organic layer 011 may also be relatively planar. That is, an inclination degree is small. In this way, the problem in the related art that a light ray emitted from the camera is refracted to deviate from a main optical axis due to the first organic layer 011 of a wedge-shaped plate structure can be further eliminated, thereby mitigating a diffraction spot deformation problem and increasing an imaging resolution. In some embodiments, under the premise of the structure shown in FIG. 8, the difference between the maximum thickness and the minimum thickness of the first portion 011A of the first organic layer 011 may also be less than a second difference threshold, and is also greater than or equal to 0. In this way, it can be ensured that the first portion 011A can also be planar, thereby further mitigating the diffraction spot deformation problem and increasing the imaging resolution.

For example, the first difference threshold is 2, and the difference between the maximum thickness and the minimum thickness of the second portion 011B of the first organic layer 011 is less than 2, for example, may be 1. The second difference threshold is 1, and the difference between the maximum thickness and the minimum thickness of the second portion 011B of the first organic layer 011 is less than 1, for example, may be 0.

Figure 9:
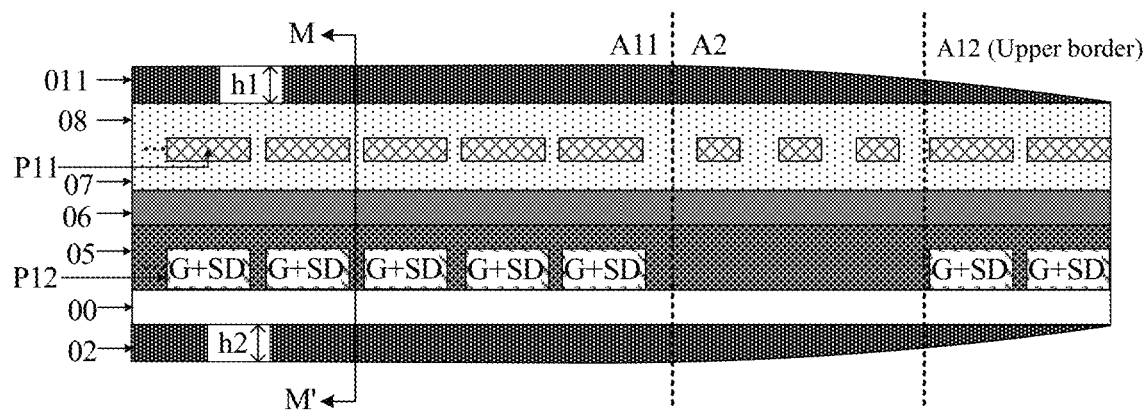
FIG. 9 is a schematic structural diagram of a display panel according to still another embodiment of the present disclosure.

In another optional embodiment, FIG. 9 shows still another display panel. The display panel further includes: a second organic layer 02 disposed on a side, distal from the plurality of pixels P1, of the base substrate 00. In addition, a thickness variation amount of the first organic layer 011 and a thickness variation amount of the second organic layer 02 are both less than a variation amount threshold. That is, the overall flatness of the first organic layer 011 is close to the overall flatness of the second organic layer 02. The thickness variation amount may be a difference between a thickness difference between a first position and a second position of a film layer and a thickness difference between a third position and a fourth position of the film layer.

For example, referring to FIG. 9, the thickness variation amount of the first organic layer 011 is equal to the thickness variation amount of the second organic layer 02. In this way, the problem in the related art that a light ray emitted from the camera is refracted to deviate from a main optical axis due to the first organic layer 011 of a wedge-shaped plate structure can be eliminated by a climbing characteristic of inversion symmetry, thereby mitigating the diffraction spot deformation problem and increasing the imaging resolution.

In some embodiments, in at least one target cross-section, a difference between a thickness of the first organic layer 011 and a thickness of the second organic layer 02 is less than a third difference threshold, and is greater than or equal to 0. The target cross-section is a cross-section of the display panel in a target direction, and the target direction is perpendicular to an arrangement direction of the first display region A1 and the second display region A2. The target cross-section is a cross-section disposed in the second display region A2.

For example, the third difference threshold may be 1, and in the target cross-section, the difference between the thickness of the first organic layer 011 and the thickness of the second organic layer 02 is less than the third difference threshold of 1, for example, may be 0. That is, as shown in FIG. 9, in a target cross-section MM', a thickness h1 of the first organic layer 011 is equal to a thickness h2 of the second organic layer 02. In this way, it can be further ensured that the display panel has a better imaging resolution.

In some embodiments, the material of the first organic layer 011 is the same as the material of the second organic layer 02. For example, the materials are both polymethylmethacrylate. That is, the first organic layer 011 and the second organic layer 02 are both made of acrylic materials.

In some embodiments, the first organic layer 011 and the second organic layer 02 are both formed by an inkjet-printing (IJP) technology. Correspondingly, the first organic layer 011 and the second organic layer 02 are both referred to as IJP layers.

Figure 10:
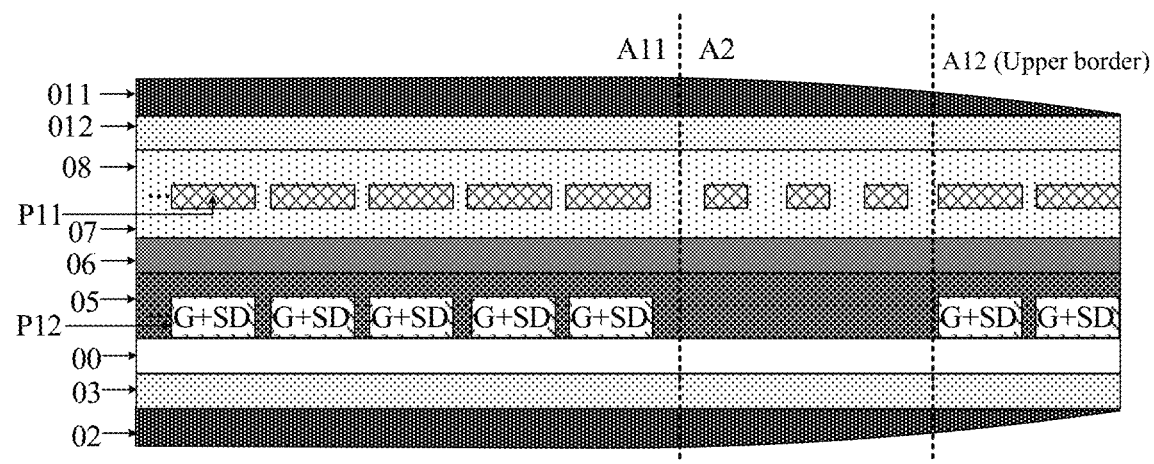
FIG. 10 is a schematic structural diagram of a display panel according to still another embodiment of the present disclosure.

In an optional embodiment, FIG. 10 shows still another display panel. The packaging layer 01 recorded in the embodiment of the present disclosure further includes a first inorganic layer 012, disposed between the plurality of pixels P1 and the first organic layer 011. Under the premise of the structure, the display panel further includes a second inorganic layer 03, disposed between the second organic layer 02 and the base substrate 00.

Both the first organic layer 011 and the second organic layer 02 are attached with inorganic layers, such that it can be ensured that the first organic layer 011 and the second organic layer 02 have similar surface tension, making it easier for the formed first organic layer 011 and second organic layer 02 to have similar climbing slopes. That is, in the target cross-section MM', the thickness of the first organic layer 011 is as close as possible to the thickness of the second organic layer 02. Correspondingly, as recorded in the foregoing embodiment, it can be further ensured that the display panel has a better imaging resolution.

Figure 11:
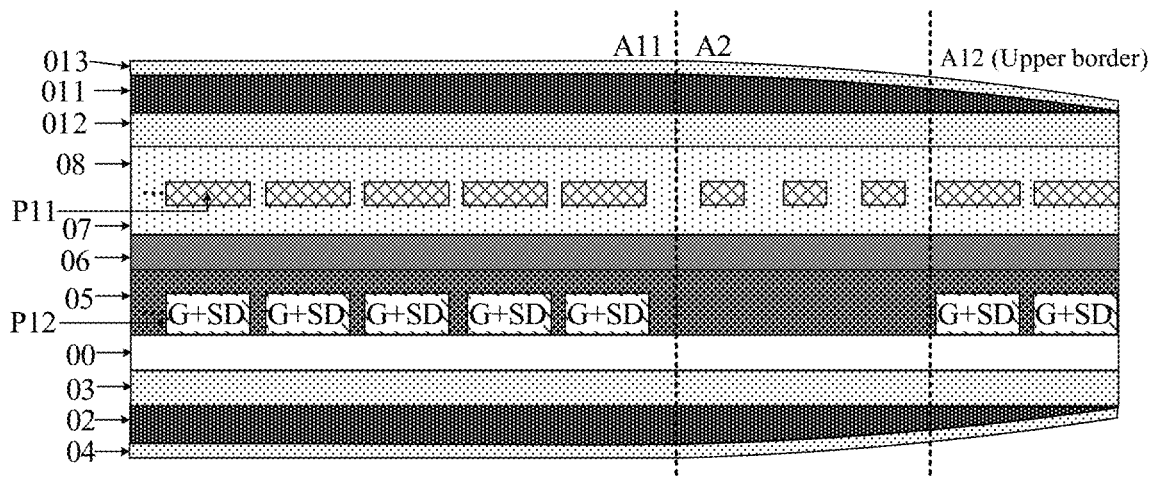
FIG. 11 is a schematic structural diagram of a display panel according to still another embodiment of the present disclosure.

In some embodiments, referring to still another display panel shown in FIG. 11, the packaging layer 01 according to the embodiment of the present disclosure further includes a third inorganic layer 013 disposed on a side, distal from the plurality of pixels P1, of the first organic layer 011. Correspondingly, the display panel further includes: a fourth inorganic layer 04 disposed on a side, distal from the base substrate 00, of the second organic layer 02.

In some embodiments, a difference between a maximum thickness and a minimum thickness of the first inorganic layer 012 and a difference between a maximum thickness and a minimum thickness of the second inorganic layer 03 both fall within a first difference range. That is, the thickness of the first inorganic layer 012 may be close to, for example, the same as the thickness of the second inorganic layer 03. And/or, a difference between a maximum thickness and a minimum thickness of the third inorganic layer 013 and a difference between a maximum thickness and a minimum thickness of the fourth inorganic layer 04 both fall within a second difference range. That is, the thickness of the third inorganic layer 013 may be close to, for example, the same as the thickness of the fourth inorganic layer 04. In this way, it can be easier to enable the first organic layer 011 and the second organic layer 02 to have similar climbing slopes.

In some embodiments, the materials of the inorganic layers included in the display panel may be the same or may be different, and for example, may include at least one of silicon dioxide (SiO), silicon nitride (SiN), and silicon oxynitride (SiNO). In addition, the inorganic layers may all be formed by using chemical vapor deposition (CVD). Correspondingly, the inorganic layers may all be referred to as CVD layers. For example, in the embodiment of the present disclosure, the first inorganic layer 012 and the second inorganic layer 03 may be referred to as CVD1, and the third inorganic layer 013 and the fourth inorganic layer 04 may be referred to as CVD2.

In some embodiments, as can be seen with reference to FIG. 8 to FIG. 11, each pixel P1 further includes a pixel circuit P12. In all FIG. 8 to FIG. 11, a layered structure G+SD formed by a gate and a source&drain (SD) is used to identify one pixel circuit P12. The pixel circuit P12 is connected (a connection relationship is not shown in the figure) to the target electrode P11 included in the pixel P1. The pixel circuit P12 is configured to provide a drive signal to the target electrode P11, to form a potential difference between the target electrode P12 and another electrode included in the pixel P1, such that the pixel P1 emits light.

In some embodiments, the target electrode P11 is an anode, and correspondingly, another electrode recorded in the foregoing embodiment is a cathode. Certainly, the target electrode P11 may be a cathode, and correspondingly, another electrode recorded in the foregoing embodiment may be an anode.

In some embodiments, referring to the structure shown in FIG. 8 to FIG. 11, the pixel circuits P12 included in the pixels P1 disposed in the second display region A2 may be disposed inside the first display region A1. In this way, it can be further ensured that the second display region A2 has a better transmittance. Certainly, the pixel circuits P12 included in the pixels P1 disposed in the second display region A2 may also be disposed inside the second display region A2. This is not limited by the embodiment of the present disclosure.

In some embodiments, as can be seen with reference to FIG. 8 to FIG. 11, the display panel further includes: a gate insulator (GI) layer 05, an inter-layer dielectric (ILD) layer 06, and a planarization (PLN) layer 07 that are disposed between the pixel circuits P12 and the target electrode P11 and are sequentially laminated in a direction away from the base substrate 00 and a pixel defining layer (PDL) 08 that is disposed between the target electrode P11 and the packaging layer 01.

In summary, according to the display panel provided by the embodiments of the present disclosure, the display panel includes a base substrate provided with a first display region and a second display region. The first display region includes a first sub-display region and a second sub-display region proximal to a border of the base substrate relative to the first sub-display region. The display panel further includes a plurality of pixels and a packaging layer that are disposed on a side of the base substrate. The packaging layer includes a first organic layer. A difference between a maximum thickness and a minimum thickness of a first portion, disposed in the second display region, of the first organic layer is less than a difference between a maximum thickness and a minimum thickness of a second portion, disposed in the second sub-display region, of the first organic layer. That is, a portion, disposed in the second display region, of the first organic layer is relatively planar, which effectively prevents a focus of a light ray emitted from a camera disposed in the second display region from deviating from a main optical axis due to refraction. In this way, it is ensured that the camera has a better imaging resolution, such that the display panel has a better imaging effect.

Figure 12:
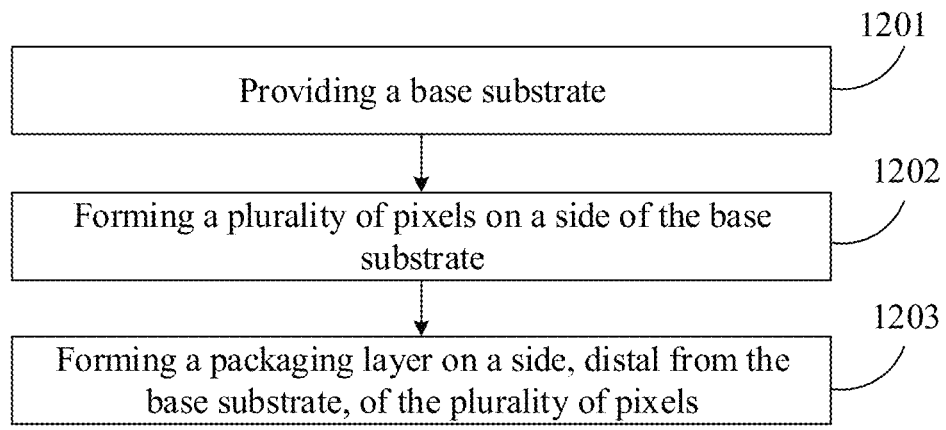
FIG. 12 is a flowchart of a method for manufacturing a display panel according to an embodiment of the present disclosure.

FIG. 12 is a flowchart of a method for manufacturing a display panel according to an embodiment of the present disclosure. The method may be used to manufacture the display panel recorded in the foregoing embodiment of the present disclosure. As shown in FIG. 12, the method includes the following steps.

In step 1201, a base substrate is provided.

As shown in FIG. 1, the base substrate 00 is provided with a first display region A1 and a second display region A2. The first display region A1 includes a first sub-display region A11 and a second sub-display region A12 and at least partially surrounds the second display region A2. The second sub-display region A12 is proximal to a border of the base substrate 00 relative to the first sub-display region A11.

In some embodiments, the base substrate 00 is made of a flexible material, for example, polyimide (PI). Correspondingly, the base substrate 00 may also be referred to as a PI substrate.

In step 1202, a plurality of pixels are formed on a side of the base substrate.

Referring to FIG. 2 to FIG. 5, the plurality of pixels P1 are separately disposed in the first display region A1 and the second display region A2. At least two pixels P1 in the plurality of pixels include target electrodes P11 and are separately disposed in the first display region A1 and the second display region A2. In addition, a size of the target electrode P11 disposed in the second display region A2 is less than the size of the target electrode P11 disposed in the first display region A1, and/or, the density of the target electrodes P11 disposed in the second display region A2 is less than the density of the target electrodes P11 disposed in the first display region A1. In this way, the transmittance of the second display region A2 is greater than the transmittance of the first display region A1.

In step 1203, a packaging layer is formed on a side, distal from the base substrate, of the plurality of pixels.

In some embodiments, referring to FIG. 3 to FIG. 5, the packaging layer 01 includes a first organic layer 011, and the difference between the maximum thickness and the minimum thickness of the first portion 011A, disposed in the second display region A2, of the first organic layer 011 is less than the difference between the maximum thickness and the minimum thickness of the second portion 011B, disposed in the second sub-display region A12, of the first organic layer 011.

In summary, according to the method for manufacturing the display panel provided by the embodiments of the present disclosure, a first portion, disposed in a second display region with a larger transmittance, of a first organic layer is relatively planar, which effectively prevents a focus of a light ray emitted from a camera disposed in the second display region from deviating from a main optical axis due to refraction. In this way, it is ensured that the camera has a better imaging resolution, such that the display panel has a better imaging effect.

Figure 13:
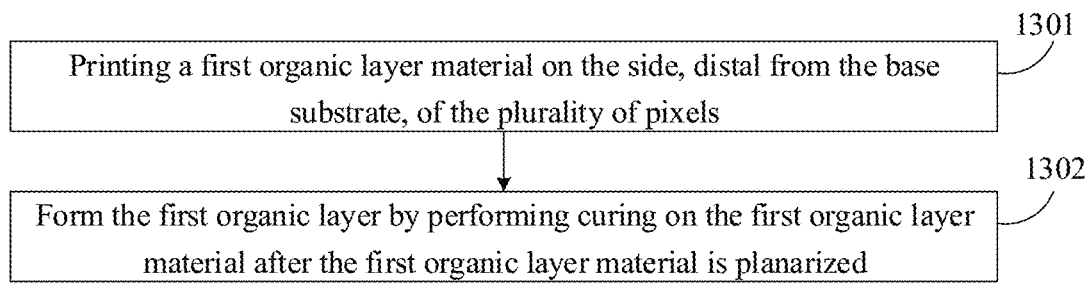
FIG. 13 is a flowchart of a method for forming a first organic layer according to an embodiment of the present disclosure.
Figure 14:
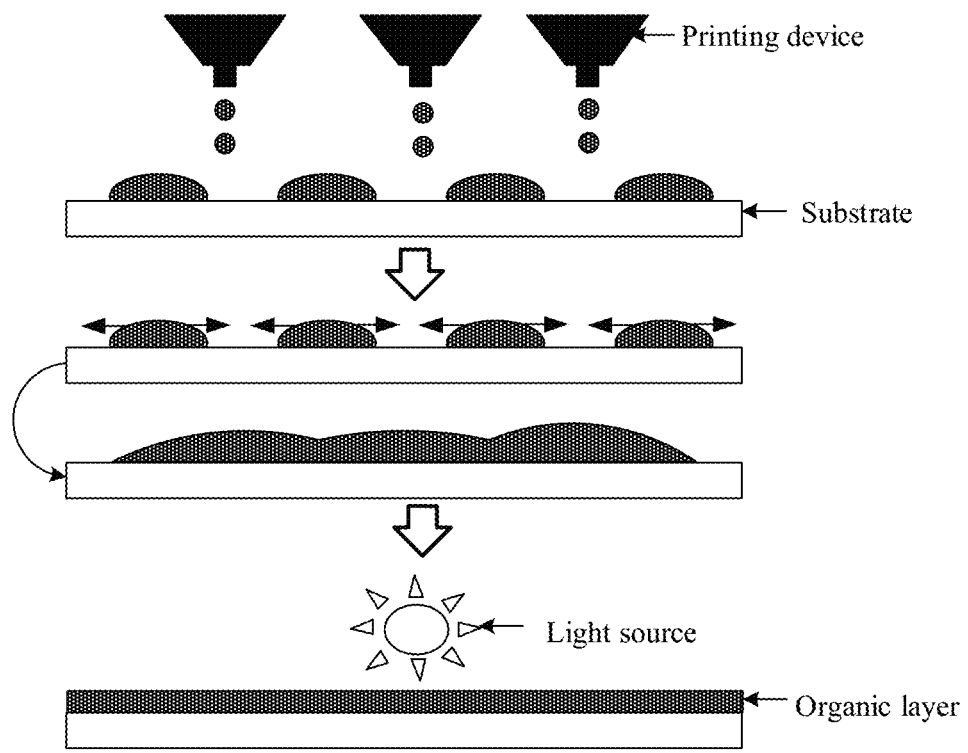
FIG. 14 is a process flowchart of forming an organic layer according to an embodiment of the present disclosure.

In some embodiments, FIG. 13 is a flowchart of a method for forming a first organic layer according to an embodiment of the present disclosure. FIG. 14 is a process flowchart of forming a first organic layer (that is, the IJP layer according to the foregoing embodiment) by using the method shown in FIG. 13.

In step 1301, a first organic layer material is printed on the side, distal from the base substrate, of the plurality of pixels.

In some embodiments, referring to FIG. 14, a substrate is used instead on the side, distal from the base substrate, of the plurality of pixels. In the embodiment of the present disclosure, a material (for example, acrylic) forming an organic layer may be first printed on the substrate by using a printing device.

In step 1302, the first organic layer is formed by performing curing on the first organic layer material after the first organic layer material is planarized.

After the first organic layer material is printed, referring to FIG. 14, the first organic layer material gradually extends toward two sides under the action of surface tension, that is, is gradually flattened. After flattening, the curing may be performed on the first organic layer material, to form the first organic layer. For example, the curing may be light curing shown in FIG. 14. That is, a light source may be used to irradiate the flattened first organic layer material, to acquire the first organic layer.

Figure 15:
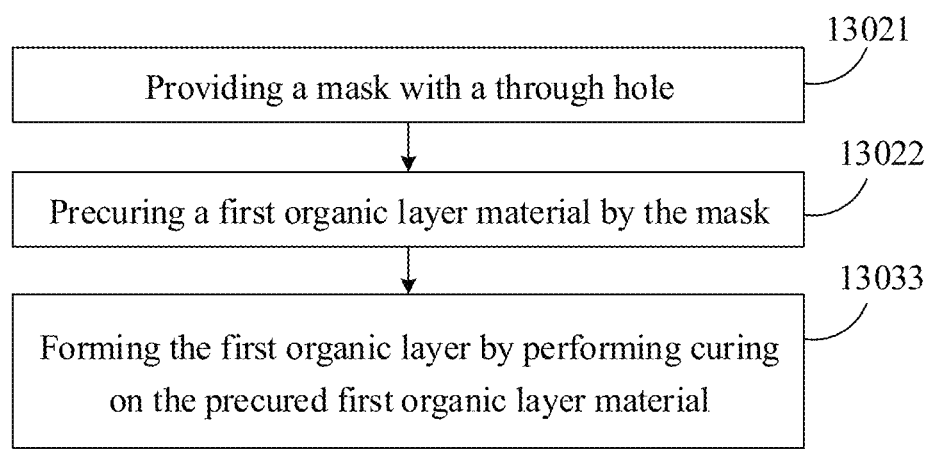
FIG. 15 is a flowchart of a method for forming a first organic layer according to another embodiment of the present disclosure.
Figure 16:
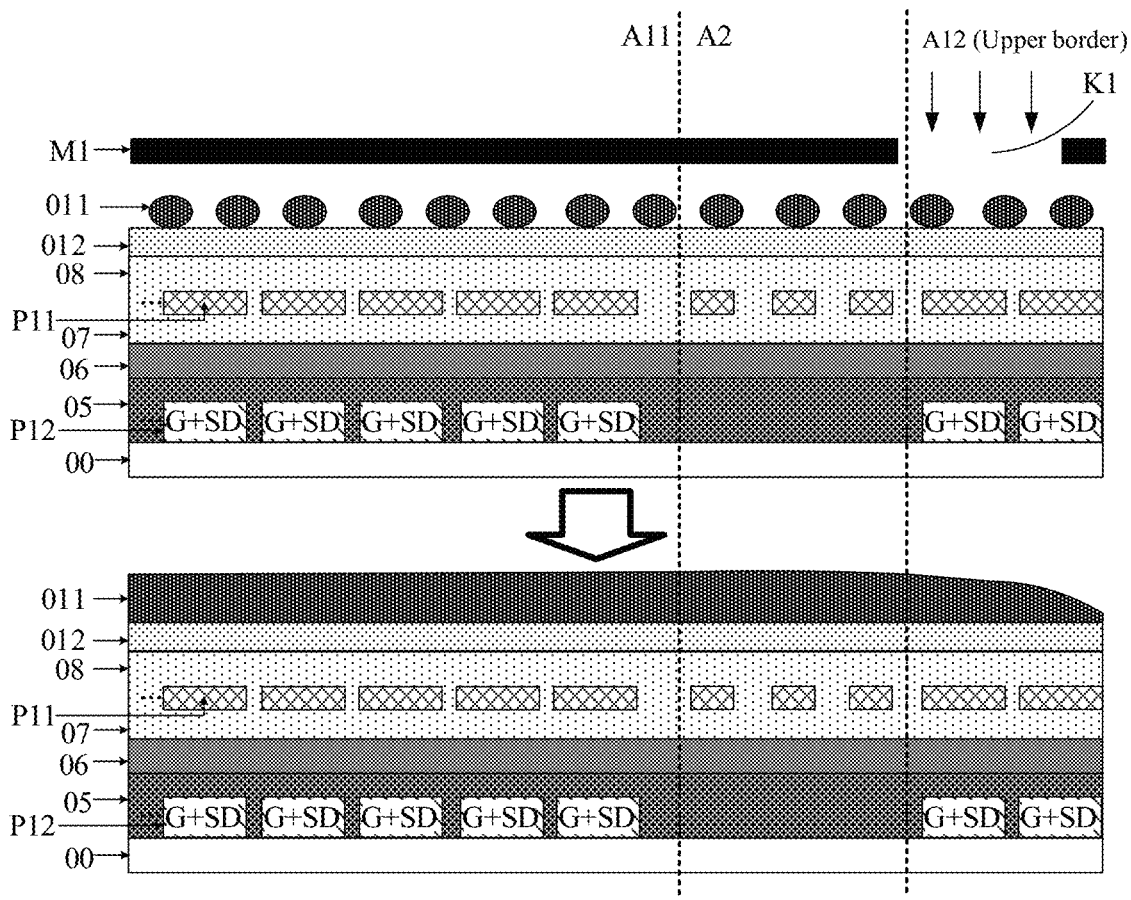
FIG. 16 is a process flowchart of forming a display panel according to an embodiment of the present disclosure.

In some embodiments, referring to the method flowchart shown in FIG. 15 and the process flowchart in FIG. 16, the foregoing step 1302 includes the following substeps.

In step 13021, a mask with a through hole is provided.

Referring to FIG. 16, a through hole K1 of a photomask M1 is provided in the second sub-display region A12.

In step 13022, the first organic layer material is precured by the mask.

In some embodiments, the precuring may also be light curing. In this way, after a first organic material is printed, the light source may be used to perform irradiation in advance at a position of the through hole K1 of the mask M1 to precure the first organic material in the region. The process may also be referred to as exposing the first organic layer material in advance.

In step 13023, the first organic layer is formed by performing the curing on the precured first organic layer material.

Finally, the photomask M1 is then removed, and the light source is used to irradiate the precured first organic layer material, to acquire the first organic layer. In this way, the second portion 011B, disposed in the second sub-display region A12, of the first organic layer 011 can be relatively planar, such that the display panel shown in FIG. 8 is acquired. The method is a method for increasing an imaging resolution according to an embodiment of the present disclosure.

Figure 17:
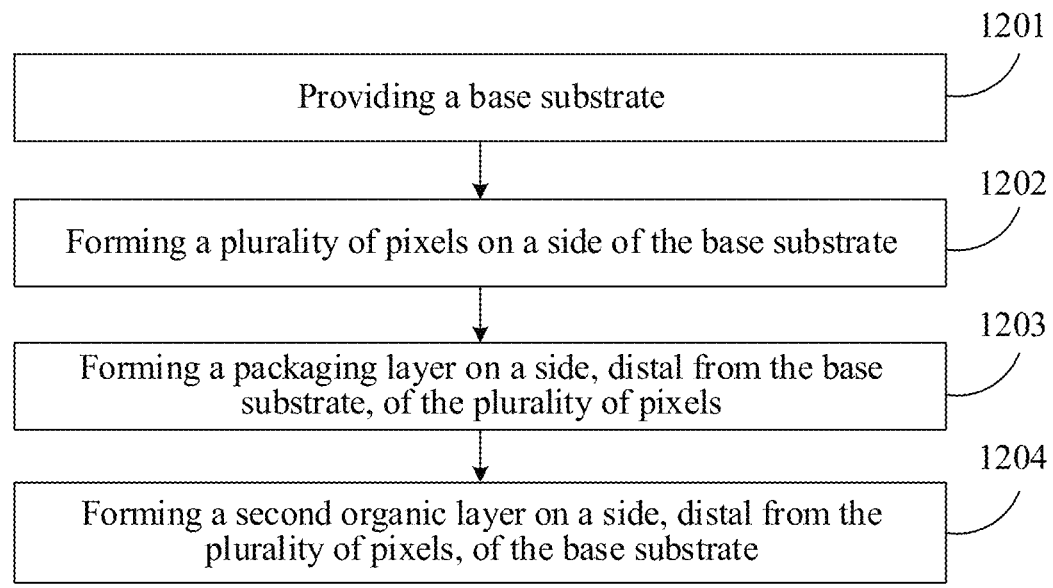
FIG. 17 is a flowchart of a method for manufacturing a display panel according to another embodiment of the present disclosure.

In some embodiments, FIG. 17 is a flowchart of a method for manufacturing a display panel. In the embodiment of the present disclosure, after step 1203, the method further includes the following steps.

In step 1204, a second organic layer is formed on a side, distal from the plurality of pixels, of the base substrate.

A thickness variation amount of the first organic layer and a thickness variation amount of the second organic layer are both less than a variation amount threshold.

Figure 18:
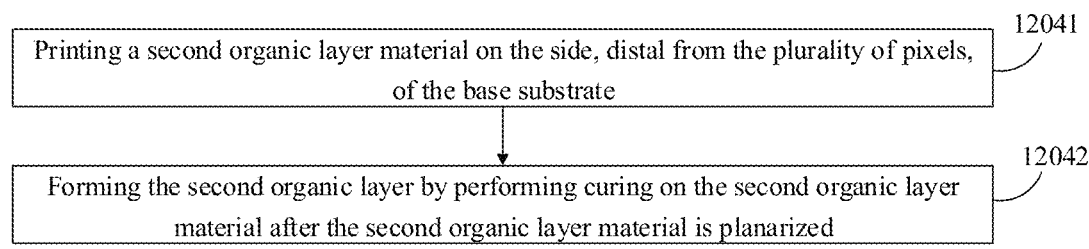
FIG. 18 is a flowchart of a method for forming a second organic layer according to an embodiment of the present disclosure.

In some embodiments, same as the foregoing method for forming the first organic layer shown in FIG. 13, the second organic layer is formed by the method shown in FIG. 18. That is, the foregoing step 1204 includes the following steps.

In step 12041, a second organic layer material is printed on the side, distal from the plurality of pixels, of the base substrate.

In some embodiments, for an implementation of the step, reference may be made to the foregoing step 1301. Details are not described again herein.

In step 12042, the second organic layer is formed by performing the curing on the second organic layer material after the second organic layer material is planarized.

In some embodiments, for an implementation of the step, reference may be made to the foregoing step 1302. Details are not described again herein.

Figure 19:
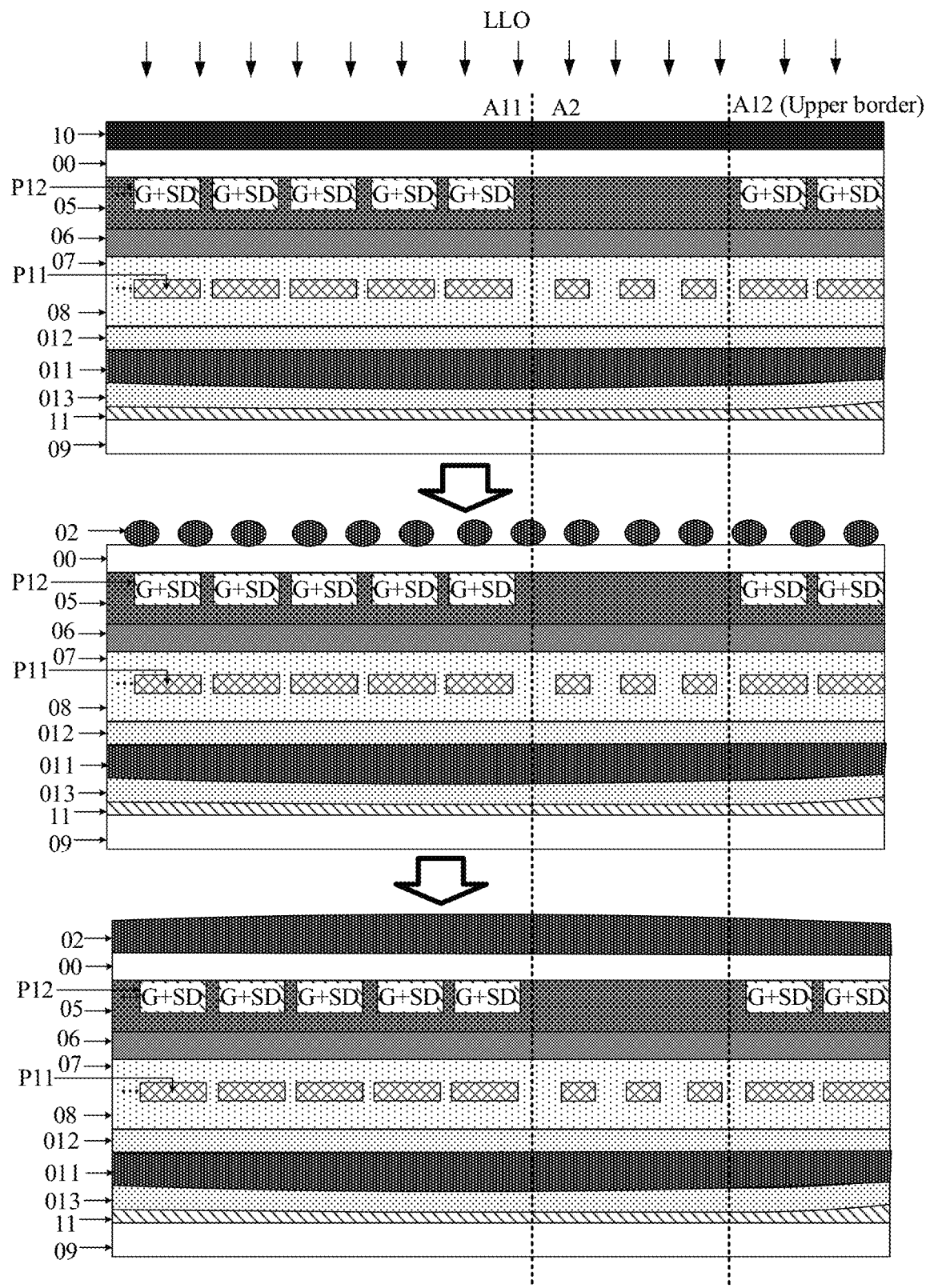
FIG. 19 is a process flowchart of forming a display panel according to another embodiment of the present disclosure.

With the method shown in FIG. 18 as an example, FIG. 19 is an entire process flowchart of forming the second organic layer. As shown in FIG. 19, during the manufacturing of the display panel, a carrier substrate 09 is usually provided to carry the layers of structure, and a glass substrate 10 is further included on a side, distal from the carrier substrate 09, of the base substrate 00. In this way, in a first step, the glass substrate 10 may be first stripped by using a stripping technology, for example, a laser lift off (LLO) technique, to expose the base substrate 00. In a second step, the second organic layer material used for forming the second organic layer 02 may be printed on the exposed base substrate 00 by using the first step shown in FIG. 14. In a third step, the printed material may then continue to be treated by using two other steps shown in FIG. 14, to acquire the second organic layer 02 disposed on a side of the base substrate 00. The method is another method for manufacturing a display panel that increases an imaging resolution according to an embodiment of the present disclosure.

Figure 20:
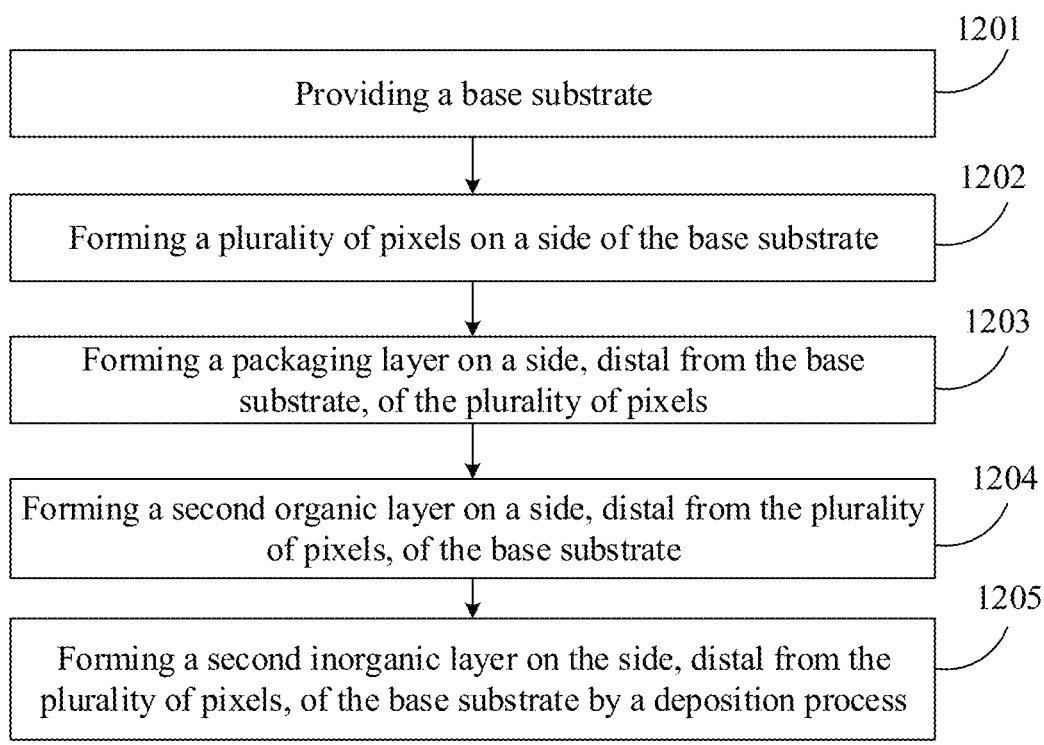
FIG. 20 is a flowchart of a method for manufacturing a display panel according to still another embodiment of the present disclosure.

As can be seen with reference to the foregoing embodiments on a device side, in the embodiment of the present disclosure, the packaging layer 01 further includes a first inorganic layer 012 disposed between the plurality of pixels P1 and the first organic layer 011. Under the premise of the structure, the display panel further includes: a second inorganic layer 03 disposed between the base substrate 00 and the second organic layer 02. That is, FIG. 20 is a flowchart of still another method for manufacturing a display panel. The method may further include the following steps.

In step 1205, a second inorganic layer is formed on the side, distal from the plurality of pixels, of the base substrate by a deposition process.

Correspondingly, referring to FIG. 20, step 1204 may be: forming the second organic layer on a side, distal from the base substrate, of the second inorganic layer.

Figure 21:
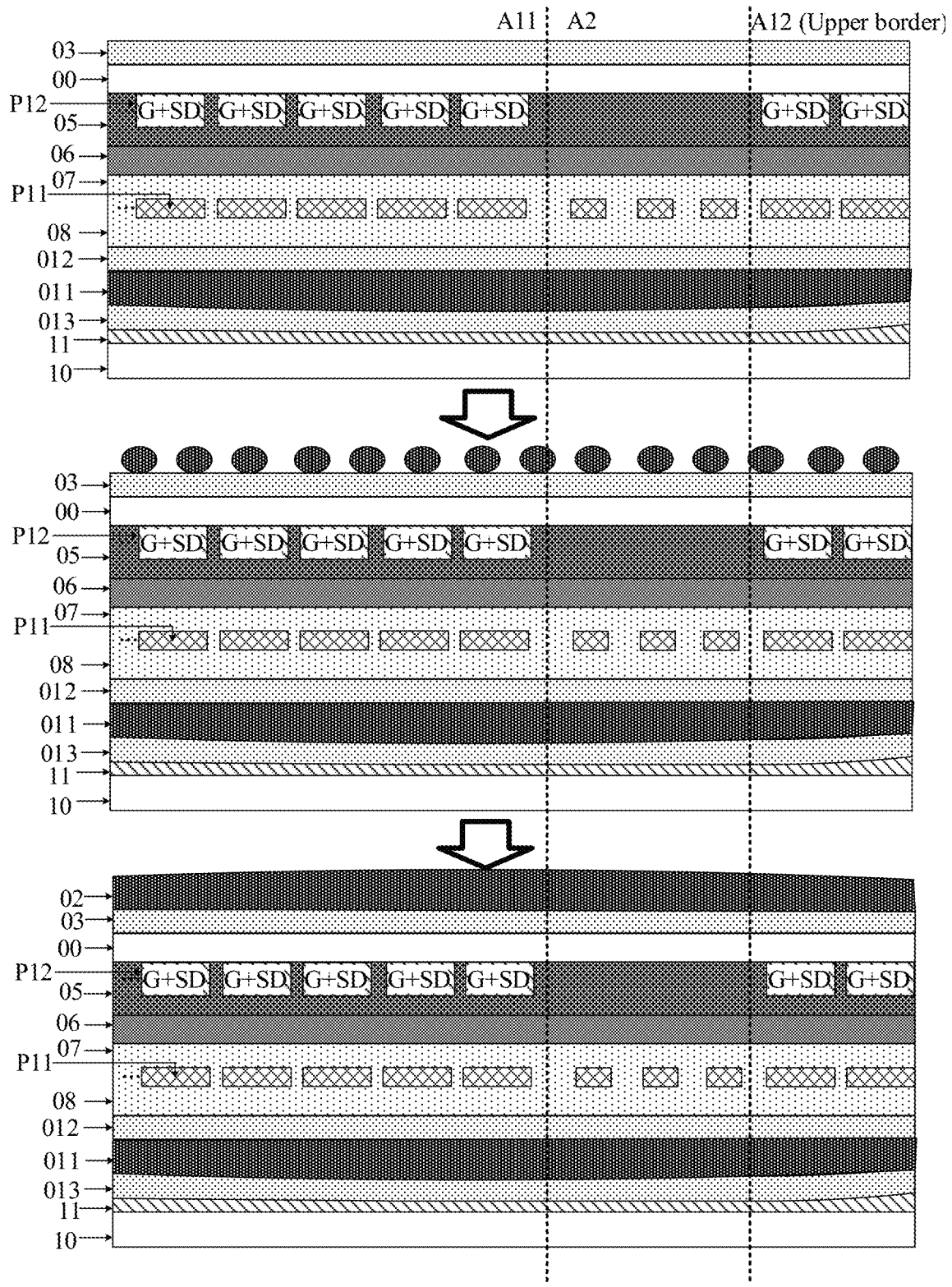
FIG. 21 is a process flowchart of forming a display panel according to still another embodiment of the present disclosure.

In some embodiments, FIG. 21 is a process flowchart of forming a second inorganic layer. Compared with a process procedure shown in FIG. 19, only one step is added between the first step and the second step in the process procedure: first depositing the second inorganic layer 03 on the base substrate 00 by a CVD method.

Figure 22:
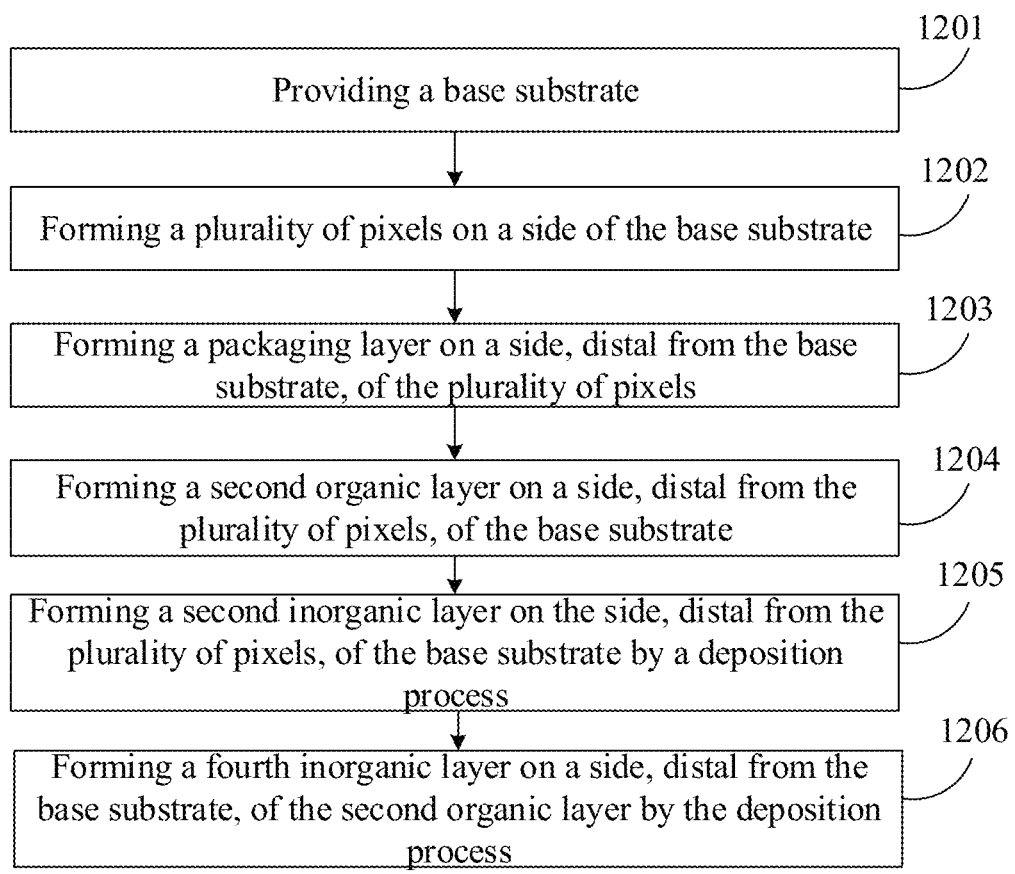
FIG. 22 is a flowchart of a method for manufacturing a display panel according to still another embodiment of the present disclosure.

In some embodiments, the packaging layer 01 further includes a third inorganic layer 013 disposed on a side, distal from the plurality of pixels, of the first organic layer 011. Under the premise of the structure, the display panel further includes: a fourth inorganic layer 04 disposed on a side, distal from the base substrate 00, of the second organic layer 02. That is, FIG. 22 is a flowchart still another method for manufacturing a display panel. The method may further include the following step.

In step 1206, a fourth inorganic layer is formed on a side, distal from the base substrate, of the second organic layer by a deposition process.

It needs to be noted that, as can be seen with reference to FIG. 19 and FIG. 21, a package film layer 11 is further included on a side, distal from the base substrate 00, of the packaging layer 01.

It further needs to be noted that, as can be seen based on the introduction of the method for manufacturing an organic layer shown in FIG. 13 and FIG. 14, a printing stop position may affect a climbing start point of the first organic layer 011. A printing amount may affect a thickness of the first organic layer 011.

Figure 23:
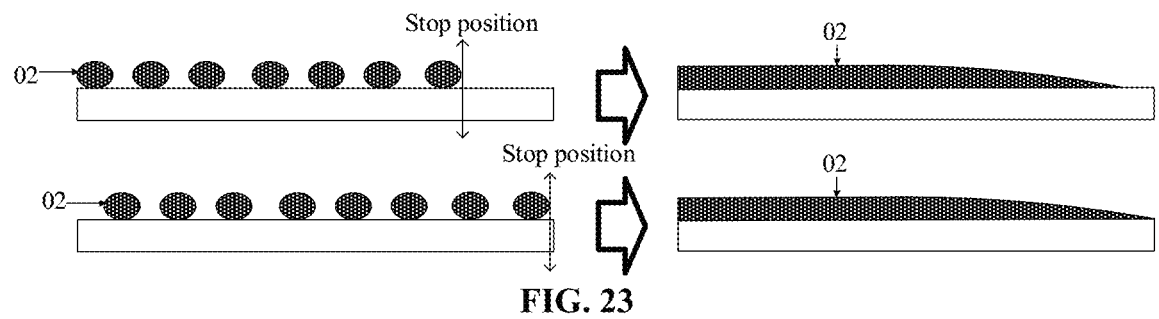
FIG. 23 is a schematic structural diagram of a formed organic layer according to optional embodiments of the present disclosure.
Figure 24:
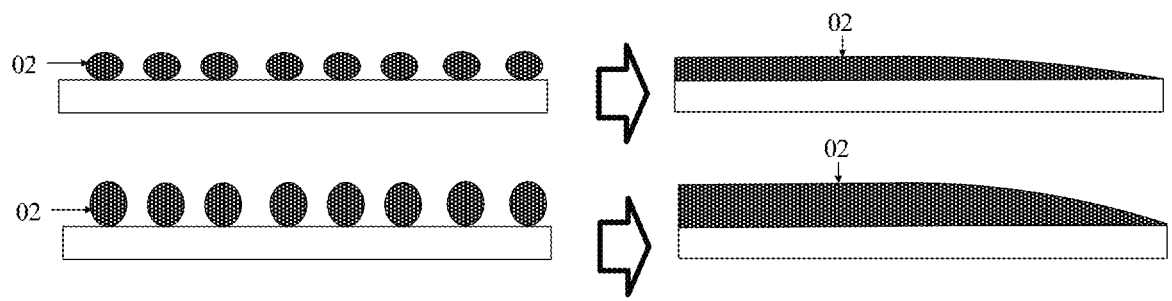
FIG. 24 is a schematic structural diagram of a formed organic layer according to optional embodiments of the present disclosure.

For example, to reflect the impact of the printing stop position on the climbing start point, FIG. 23 shows climbing start points of the first organic layer 011 that correspond to different printing stop positions. To reflect the impact of the printing amount on the thickness of the first organic layer 011, FIG. 24 shows thicknesses of the first organic layer 011 that correspond to different printing amounts. As can be seen with reference to FIG. 23, the closer the printing stop position is to a border of the substrate, the closer the climbing start point of the first organic layer 011 is to the border. As can be seen with reference to FIG. 24, the larger the printing amount is, and the larger the thickness of the first organic layer 011 is, that is, the thicker the first organic layer 011 is. In this way, the thickness and position of the first organic layer 011 can be improved by adjusting the printing stop position and the printing amount.

In summary, according to the method for manufacturing the display panel provided by the embodiments of the present disclosure, a first portion, disposed in a second display region with a larger transmittance, of a first organic layer is relatively planar, which effectively prevents a focus of a light ray emitted from a camera disposed in the second display region from deviating from a main optical axis due to refraction. In this way, it is ensured that the camera has a better imaging resolution, such that the display panel has a better imaging effect.

Figure 25:
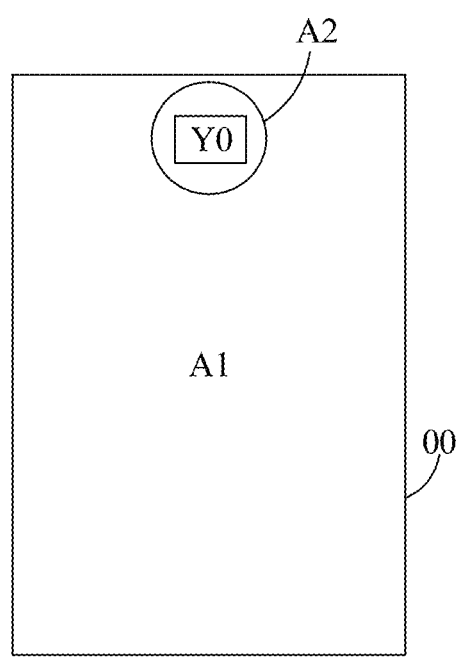
FIG. 25 is a schematic structural diagram of a display device according to an embodiment of the present disclosure.

In some embodiments, FIG. 25 is a schematic structural diagram of a display device according to an embodiment of the present disclosure. As shown in FIG. 25, the display device includes a photosensitive sensor Y0 and the display panel according to the foregoing embodiment. The photosensitive sensor Y0 is disposed in a second display region A2 of the display panel. The photosensitive sensor Y0 is configured to implement a photographing function and an imaging function.

In some embodiments, the display device may be any product or component with a display function such as an organic light-emitting diode (OLED) display device, a liquid crystal display (LCD) device, an active-matrix organic light-emitting diode (AMOLED) display device, a mobile phone, a tablet computer, a flexible display device, a television, and a display.

In the embodiments of the present disclosure, the terms "first," "second," "third," and "fourth" are merely intended for description, but are not intended to indicate or imply relative importance.

The term "a plurality of" in the embodiments of the present disclosure refers to two or more than two.

In the embodiments of the present disclosure, the term "and/or" is only to describe an association relationship of associated targets, and represents that three relationships may exist. For example, A and/or B may represent the following three cases: A exists separately, both A and B exist, and B exists separately.

Described above are merely optional embodiments of the present disclosure, but are not intended to limit the present disclosure. Any modifications, equivalent replacements, improvements and the like made within the spirit and principles of the present disclosure shall be included within the scope of protection of the present disclosure.

What is claimed is:

1. A display panel, comprising:
a base substrate provided with a first display region and a second display region, wherein the first display region comprises a first sub-display region and a second sub-display region, and at least partially surrounds the second display region, the second sub-display region being proximal to a border of the base substrate relative to the first sub-display region;
a plurality of pixels separately disposed in the first display region and the second display region, wherein at least two pixels in the plurality of pixels comprise target electrodes and are separately disposed in the first display region and the second display region, a size of the target electrode disposed in the second display region being less than a size of the target electrode disposed in the first display region, and/or a density of the target electrodes disposed in the second display region being less than a density of the target electrodes disposed in the first display region; and
a packaging layer disposed on a side, distal from the base substrate, of the plurality of pixels, wherein the packaging layer comprises a first organic layer, and a difference between a maximum thickness and a minimum thickness of a first portion, disposed in the second display region, of the first organic layer being less than a difference between a maximum thickness and a minimum thickness of a second portion, disposed in the second sub-display region, of the first organic layer.

2. The display panel according to claim 1, wherein the first display region surrounds the second display region; and the base substrate at least comprises a first edge and a second edge that are parallel to each other;
wherein a distance between a geometric center of the second display region and the first edge of the base substrate is less than a distance between a geometric center of the second display region and the second edge of the base substrate.

3. The display panel according to claim 2, wherein the base substrate is a rectangle, and the first edge and the second edge are both short edges of the rectangle.

4. The display panel according to claim 2, wherein in a direction toward the first edge, a thickness of the first organic layer is gradually decreased; and an average thickness of the first portion of the first organic layer is greater than an average thickness of the second portion of the first organic layer.

5. The display panel according to claim 1, wherein the difference between the maximum thickness and the minimum thickness of the second portion of the first organic layer is less than a first difference threshold.

6. The display panel according to claim 1, wherein the difference between the maximum thickness and the minimum thickness of the first portion of the first organic layer is less than a second difference threshold.

7. The display panel according to claim 1, wherein the display panel further comprises: a second organic layer disposed on a side, distal from the plurality of pixels, of the base substrate;

wherein a thickness variation amount of the first organic layer and a thickness variation amount of the second organic layer are both less than a variation amount threshold.

8. The display panel according to claim 7, wherein the thickness variation amount of the first organic layer is equal to the thickness variation amount of the second organic layer.

9. The display panel according to claim 7, wherein in at least one target cross-section, a difference between a thickness of the first organic layer and a thickness of the second organic layer is less than a third difference threshold,
wherein the target cross-section is a cross-section of the display panel in a target direction, and the target direction is perpendicular to an arrangement direction of the first display region and the second display region.

10. The display panel according to claim 9, wherein in the at least one target cross-section, the thickness of the first organic layer is equal to the thickness of the second organic layer.

11. The display panel according to claim 7, wherein the first organic layer and the second organic layer are both made of polymethylmethacrylate.

12. The display panel according to claim 7, wherein the packaging layer further comprises: a first inorganic layer disposed between the plurality of pixels and the first organic layer.

13. The display panel according to claim 12, further comprising: a second inorganic layer disposed between the second organic layer and the base substrate.

14. The display panel according to claim 7, wherein the packaging layer further comprises: a third inorganic layer disposed on a side, distal from the plurality of pixels, of the first organic layer.

15. The display panel according to claim 14, further comprising: a fourth inorganic layer disposed on a side, distal from the base substrate, of the second organic layer.

16. The display panel according to claim 12, wherein
a difference between a maximum thickness and a minimum thickness of the first inorganic layer and a difference between a maximum thickness and a minimum thickness of the second inorganic layer both fall within a first difference range; and/or
a difference between a maximum thickness and a minimum thickness of the third inorganic layer and a difference between a maximum thickness and a minimum thickness of the fourth inorganic layer both fall within a second difference range.

17. The display panel according to claim 12, wherein an inorganic layer in the display panel is made of at least one of silicon dioxide (SiO), silicon nitride (SiN), and silicon oxynitride (SiNO).

18. The display panel according to claim 1, wherein the target electrode is an anode.

19. A method for manufacturing a display panel, comprising:
providing a base substrate, wherein the base substrate is provided with a first display region and a second display region, the first display region comprising a first sub-display region and a second sub-display region and at least partially surrounding the second display region, the second sub-display region being proximal to a border of the base substrate relative to the first sub-display region;
forming a plurality of pixels on a side of the base substrate, wherein the plurality of pixels are separately disposed in the first display region and the second display region, at least two pixels in the plurality of pixels comprise target electrodes and are separately disposed in the first display region and the second display region, a size of the target electrode disposed in the second display region being less than a size of the target electrode disposed in the first display region, and/or a density of the target electrodes disposed in the second display region being less than a density of the target electrodes disposed in the first display region; and
forming a packaging layer on a side, distal from the base substrate, of the plurality of pixels, wherein the packaging layer comprises a first organic layer, a difference between a maximum thickness and a minimum thickness of a first portion, disposed in the second display region, of the first organic layer being less than a difference between a maximum thickness and a minimum thickness of a second portion, disposed in the second sub-display region, of the first organic layer.

20. A display device, comprising: a photosensitive sensor and a display panel, wherein the display panel comprises:
a base substrate provided with a first display region and a second display region, wherein the first display region comprises a first sub-display region and a second sub-display region, and at least partially surrounds the second display region, the second sub-display region being proximal to a border of the base substrate relative to the first sub-display region;
a plurality of pixels separately disposed in the first display region and the second display region, wherein at least two pixels in the plurality of pixels comprise target electrodes and are separately disposed in the first display region and the second display region, a size of the target electrode disposed in the second display region being less than a size of the target electrode disposed in the first display region, and/or a density of the target electrodes disposed in the second display region being less than a density of the target electrodes disposed in the first display region; and
a packaging layer disposed on a side, distal from the base substrate, of the plurality of pixels, wherein the packaging layer comprises a first organic layer, and a difference between a maximum thickness and a minimum thickness of a first portion, disposed in the second display region, of the first organic layer being less than a difference between a maximum thickness and a minimum thickness of a second portion, disposed in the second sub-display region, of the first organic layer,
and wherein the photosensitive sensor is disposed in the second display region of the display panel.

* * * * *